United States Patent
Perez et al.

(10) Patent No.: US 8,729,779 B2
(45) Date of Patent: May 20, 2014

(54) WIDE BANDWIDTH SLANTED-FINGER CONTOUR-MODE PIEZOELECTRIC DEVICES

(75) Inventors: Carlos R. Perez, Miami, FL (US); Gianluca Piazza, Philadelphia, PA (US)

(73) Assignee: The Trustees of the University of Pennsylvania, Philadelphia, PA (US)

(*) Notice: Subject to any disclaimer, the term of this patent is extended or adjusted under 35 U.S.C. 154(b) by 36 days.

(21) Appl. No.: 13/263,194

(22) PCT Filed: Apr. 9, 2010

(86) PCT No.: PCT/US2010/030506
§ 371 (c)(1),
(2), (4) Date: Feb. 24, 2012

(87) PCT Pub. No.: WO2010/138243
PCT Pub. Date: Dec. 2, 2010

(65) Prior Publication Data
US 2012/0139665 A1    Jun. 7, 2012

Related U.S. Application Data

(60) Provisional application No. 61/168,021, filed on Apr. 9, 2009.

(51) Int. Cl.
*H01L 41/053*    (2006.01)
(52) U.S. Cl.
USPC ............................. 310/367; 310/365; 310/321
(58) Field of Classification Search
USPC .......... 310/320, 365–371, 321, 311; 333/187, 333/189, 193
IPC ................................. H01L 41/04,41/053, 41/08
See application file for complete search history.

(56) References Cited

U.S. PATENT DOCUMENTS

| | | | |
|---|---|---|---|
| 5,182,485 A * | 1/1993 | de la Fonteijne | 310/367 |
| 5,583,291 A * | 12/1996 | Gutteridge et al. | 73/514.38 |
| 6,909,221 B2 * | 6/2005 | Ayazi et al. | 310/321 |
| 7,492,241 B2 * | 2/2009 | Piazza et al. | 310/321 |
| 7,812,692 B2 * | 10/2010 | Ayazi et al. | 310/321 |
| 8,575,819 B1 * | 11/2013 | Bhugra et al. | 310/317 |
| 2002/0105392 A1 | 8/2002 | Fujii | |
| 2005/0200432 A1 * | 9/2005 | Inoue et al. | 333/189 |
| 2006/0290449 A1 * | 12/2006 | Piazza et al. | 333/187 |
| 2007/0252485 A1 * | 11/2007 | Kawakubo et al. | 310/365 |

OTHER PUBLICATIONS

Zuo et al., "Multi-Frequency Pierce Oscillators Based on Piezoelectric AlN Contour-Mode MEMS Resonators," University of Pennsylvania, Department of Electrical & Systems Engineering, Departmental Papers (ESE), May 2008, pp. 402-407.

(Continued)

*Primary Examiner* — Thomas Dougherty
*Assistant Examiner* — Karen B Addison
(74) *Attorney, Agent, or Firm* — RatnerPrestia

(57) ABSTRACT

Contour-mode piezoelectric devices and methods of forming contour mode piezoelectric devices. The contour mode piezoelectric device includes a piezoelectric film having first and second surfaces and suspended so that it is spaced away from a substrate. The contour mode piezoelectric device also includes first and second patterned electrodes respectively disposed on the first and second surfaces of the piezoelectric film, at least one of the first and second patterned electrodes having variable width along a length thereof.

24 Claims, 11 Drawing Sheets

(56) References Cited

OTHER PUBLICATIONS

Preumont et al., "Spatial Filtering With Piezoelectric Films Via Porous Electrode Design," 13$^{th}$ International Conference on Adaptive Structures and Technologies, Oct. 7-9, 2002, Potsdam/Berlin, Germany.

Maxey, "Switched-Tank VCO Designs and Single Crystal Silicon Contour-Mode Disk Resonators For Use in Multiband Radio Frequency Sources," Jul. 30, 2004, pp. i-221.

Search Report for PCT International Application No. PCT/US10/30506, mailed Nov. 9, 2010.

* cited by examiner

US 8,729,779 B2

WIDE BANDWIDTH SLANTED-FINGER CONTOUR-MODE PIEZOELECTRIC DEVICES

STATEMENT REGARDING FEDERALLY SPONSORED RESEARCH

The present invention was supported in part by a grant from Honeywell-Defense Advanced Research Projects Agency (DARPA) (Grant No. 130-1304-4-547314-5229-2000-0197). The United States Government has certain rights to the invention.

CROSS REFERENCE TO RELATED APPLICATIONS

This application is a U.S. National Phase Application of PCT International Application No. PCT/US2010/030506, filed Apr. 9, 2010 and is related to and claims the benefit of U.S. Provisional Application No. 61/168,021 entitled WIDE BANDWIDTH SLANTED-FINGER CONTOUR-MODE PIEZOELECTRIC DEVICES filed on Apr. 9, 2009, the contents of which are incorporated herein by reference.

FIELD OF THE INVENTION

The present invention relates to contour-mode piezoelectric devices. More particularly, the present invention relates to contour-mode piezoelectric devices and methods of forming contour-mode piezoelectric devices having patterned electrodes with variable width.

BACKGROUND OF THE INVENTION

Piezoelectric transducers, in general, convert electrical signals into mechanical vibrations or vice versa. Piezoelectric transducers typically utilize a piezoelectric film where electrical signals or mechanical vibrations induce a morphological change of the piezoelectric film (i.e., due to voltage application or due to a pressure applied to the piezoelectric film). Piezoelectric transducers are generally used to actuate/sense different frequencies. Piezoelectric transducers may operate as a resonator to provide a maximum response when operated at its resonant frequency.

One typical piezoelectric transducer includes a surface acoustic wave (SAW) transducer that, when excited, produces mechanical vibrations along the surface of the piezoelectric film. SAW piezoelectric transducers typically do not scale well to radio frequency (RF) applications due to a need for submicrometer lithography and decreasing power handling capabilities. Another type of piezoelectric transducer includes a contour-mode piezoelectric transducer that, when excited, produces mechanical vibrations throughout the piezoelectric film and where the fundamental frequency is defined by the in-planed dimensions of the piezoelectric film.

In general, there is a need for RF-capable piezoelectric transducers which are small in size, energy efficient, capable of complementary metal oxide semiconductor (CMOS) integration, capable of sensing/actuating at high frequencies and that are inexpensive.

SUMMARY OF THE INVENTION

The present invention relates to contour-mode piezoelectric devices and methods of forming contour mode piezoelectric devices. The contour mode piezoelectric device includes a piezoelectric film having first and second surfaces and suspended so that it is spaced away from a substrate. The contour mode piezoelectric device also includes first and second patterned electrodes respectively disposed on the first and second surfaces of the piezoelectric film, at least one of the first and second patterned electrodes having variable width along a length thereof.

BRIEF DESCRIPTION OF THE DRAWINGS

The invention may be understood from the following detailed description when read in connection with the accompanying drawings. It is emphasized that, according to common practice, various features/elements of the drawings may not be drawn to scale. On the contrary, the dimensions of the various features/elements may be arbitrarily expanded or reduced for clarity. Moreover, in the drawings, common numerical references are used to represent like features/elements. Included in the drawings are the following figures.

DETAILED DESCRIPTION OF THE INVENTION

Aspects of the present invention include a contour-mode piezoelectric device (i.e. a piezoelectric transducer). The piezoelectric device includes a piezoelectric film that is suspended so that it is spaced away from a substrate. First and second patterned electrodes are respectively disposed on first and second surfaces of the piezoelectric film. At least one of the first and second patterned electrodes has a variable width relative to a length of the respective electrode.

Figure 1A:
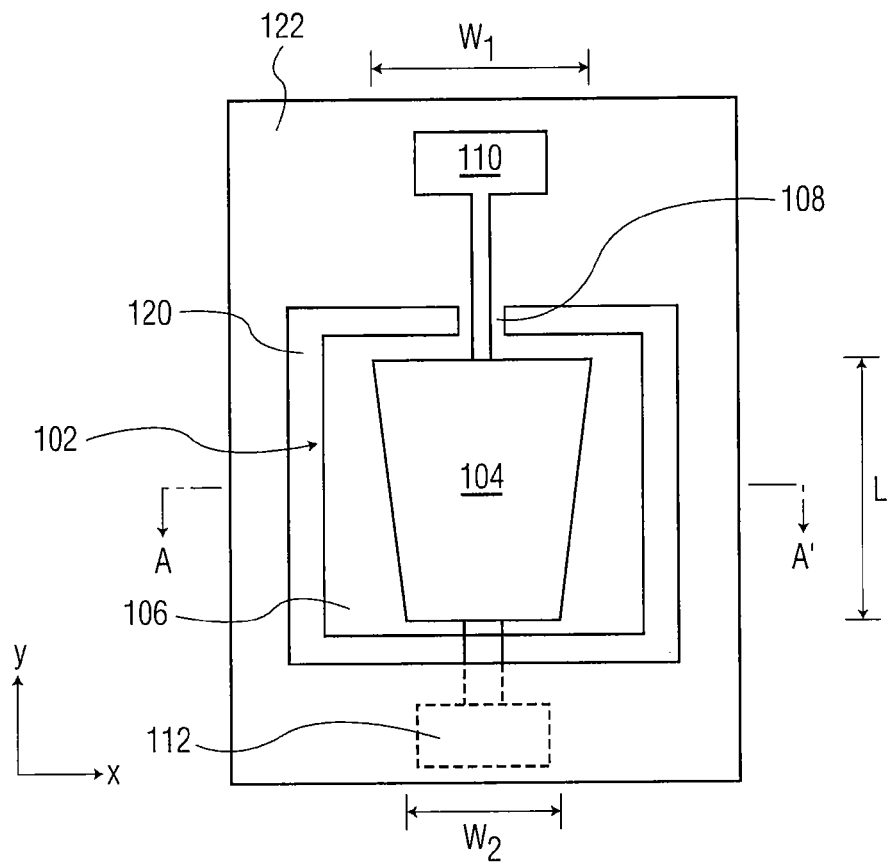
FIG. 1A is an overhead diagram of an exemplary one-port piezoelectric device, according to an embodiment of the present invention.
Figure 1B:
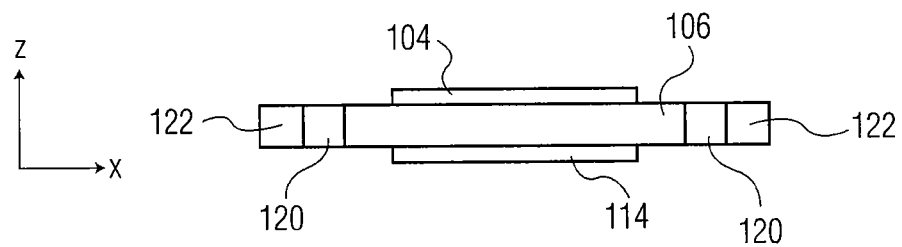
FIG. 1B is a cross-section of the piezoelectric device shown in FIG. 1A along lines A, A'.

Referring to FIGS. 1A and 1B, exemplary one-port piezoelectric device 102 is shown suspended from substrate 122. In particular, FIG. 1A is an overhead diagram of one-port piezoelectric device 102 and substrate 122; and FIG. 1B is a cross-section of piezoelectric device 102 and substrate 122 along lines A, A'.

Piezoelectric device 102 include piezoelectric film 106, first (i.e. top) patterned electrode 104 and second (i.e. bottom) patterned electrode 114. Top and bottom patterned electrodes 104, 114 are disposed on opposite surface of piezoelectric film 106. Top electrode 104 is illustrated as having a variable width (i.e., from $W_1$ to $W_2$) along length L. It is understood that either top electrode 104, bottom electrode 114 or the combination thereof may have a variable width. Accordingly, in the description herein, although reference is made to top electrode 104, it is understood that bottom electrode 114 may be similarly described.

Piezoelectric film 106 (and, thus, piezoelectric device 102) is suspended so that it is spaced away from substrate 122. Piezoelectric device 102 is tethered to substrate 122 by one or more tethers 108 and is separated from substrate 122 by etched portion 120. Input/output (I/O) contact 110 is coupled to top electrode 104 and ground contact 112 is coupled to bottom electrode 114. Because piezoelectric device 102 is suspended from substrate 122, all electrical connections may be provided via tethers 108. A number of tethers 108, thus, may be a selected according to a suitable number and/or arrangement of electrical connections to piezoelectric device 102.

By patterning top electrode 104 to have a variable width, piezoelectric device 102 may be designed to excite multiple center frequencies (i.e. multiple have wavelengths) within piezoelectric film 106, described further below with respect to FIGS. 2A, 2B and 6B. The multiple center frequencies contribute to the overall bandwidth (BW) and the overall center frequency of piezoelectric device 102. As described further below with respect to FIGS. 2A and 2B, the multiple center frequencies can be weighted to emphasis/deemphasize particular frequency contributions by applying a shape profile to electrode 104 along length L.

A shape of piezoelectric film 106 may also be configured to control the bandwidth and center frequency of piezoelectric device 102. For example, in FIG. 1A, piezoelectric film 106 is rectangular whereas, in FIG. 8A, piezoelectric film 806 is trapezoidal. Piezoelectric film 106 may be formed into any suitable shape for controlling the bandwidth and center frequency of piezoelectric device 102. Examples of piezoelectric film shape include, but are not limited to, a rectangle, a ring, a circle, or any other polygon shape. Piezoelectric film 106 may be formed from any suitable piezoelectric material, for example aluminum nitride, zinc oxide, lead zirconate titanate, gallium arsenide, aluminum gallium arsenide or any combination thereof.

The bandwidth, center frequency and frequency response of piezoelectric device 102 may be controlled by the combination of variable-width electrode 104, application of an electrode shape profile to electrode 104 and shaping of piezoelectric film 106. In general, the mechanical response of piezoelectric device 102 may be affected by applying a shape profile to electrode 104 as well as by shaping piezoelectric film 106. Because piezoelectric film 106 shaping is restricted substantially to a perimeter of piezoelectric device 102, the shape profile of electrode 104 may have a more substantial impact on the mechanical response and the frequency response of piezoelectric device 102.

It is understood that any metallic material may be used for top/bottom electrodes 104, 114, provided that the metallic material satisfies any desired material compatibility with piezoelectric film 106 (e.g., adhesion, formation of deleterious phases with piezoelectric film 106, or a quality of piezoelectric film 106 that may be deposited thereto). Examples of materials for electrode 104, 114 include aluminum, platinum, iridium, ruthenium, molybdenum, titanium or copper. In general, materials with a low electric resistance and a suitable acoustic match to piezoelectric film 106 are desired.

Figure 2A:
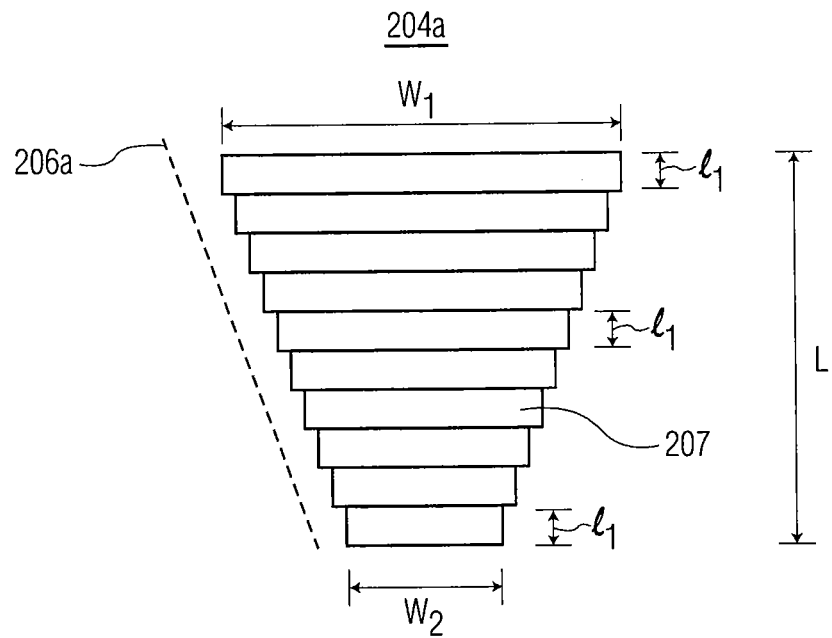
FIGS. 2A and 2B are overhead diagrams of exemplary patterned electrodes illustrating electrode shaping, according to embodiments of the present invention.
Figure 2B:
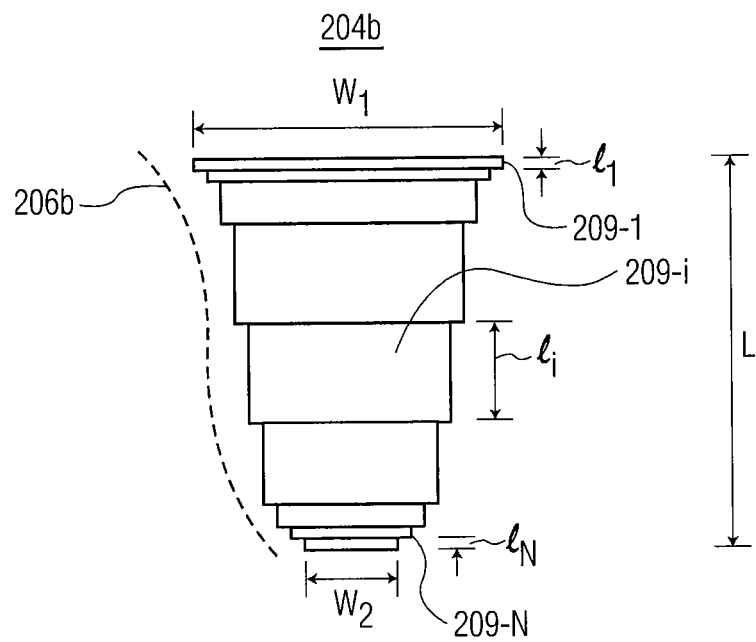
Figure 3:
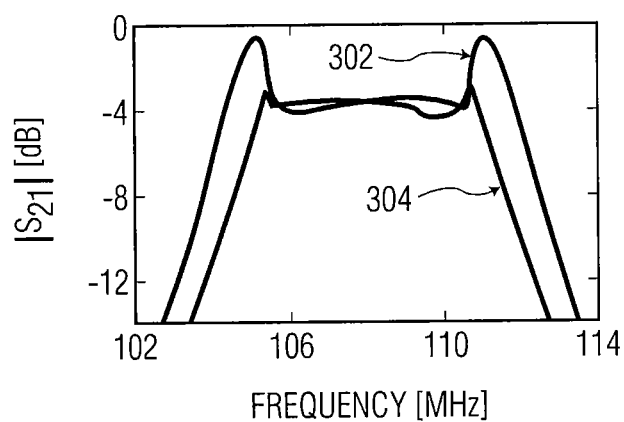
FIG. 3 is a graph of insertion loss as a function of frequency for the electrode shaping shown in FIGS. 2A and 2B.

Referring next to FIGS. 2A, 2B and 3, shape profiles 206a, 206b of respective exemplary electrodes 204a, 204b is described. In particular, FIGS. 2A and 2B are overhead diagrams illustrating electrode shape profiles 206; and FIG. 3 is a graph of insertion loss as a function of frequency according to the electrode shape profiles 206 shown in FIGS. 2A and 2B.

In FIG. 2A, electrode 204a includes a plurality of sub-electrodes 207, where each sub-electrode 207 corresponds to a different center frequency. Each sub-electrode 207 varies from width $W_1$ to $W_2$ and has a same length $l_1$. Because each sub-electrode 207 has a same length $l_1$, each center frequency is equally weighted (i.e. emphasized). Furthermore, because each sub-electrode 207 has the same length $l_1$, shape profile 206a relative to length L is substantially linear. Thus, electrode 204a can be considered to include a variable width (i.e. from $W_1$ to $W_2$) with linear shape profile 206a.

In FIG. 2B, electrode 204b includes sub-electrodes 209-1, 209-i ... 209-N, having respective lengths $l_1, l_i ... l_N$. In FIG. 2B, sub-electrode 209-i (i.e., one of the center sub-electrodes 209 relative to length L) has a greater length $l_i$ compared with sub-electrodes 209-1, 209-N at the edges of electrode 204B (i.e., $l_i > l_1, l_N$). In this example, the contribution of center frequencies near the center of electrode 204b is emphasized whereas contributions from center frequencies near the edges of electrode 204b are deemphasized. Because each sub-electrode 209 has a different width and a different length, shape profile 206b relative to length L is non-linear. It is understood that electrode shape profile 206 may be of any shape suitable for weighting frequencies in a pass-band of piezoelectric device 102 (FIG. 1). Examples of shape profile 206 include, but are not limited to linear, nonlinear, quadratic, exponential, logarithmic shapes.

In general, because each sub-electrode 207, 209 has a variable width, multiple center frequencies are excited within piezoelectric film 106 (FIG. 1). Because the length $l_i$ of each sub-electrode 209 may be varied, the individual contributions of the center frequencies may be adjusted. Referring to FIG. 3, a simulation of insertion loss (IS) as a function of frequency is shown for electrode 204a (IS 302) and electrode 204b (IS 304). Because electrode 204a (FIG. 2A) emphasizes each center frequency equally, a large ripple is generated in the pass-band (IS 302). In contrast, electrode 204b (FIG. 2B) de-emphasizes the center frequencies at the edges of electrode 204b such that a ripple is substantially reduced in the pass-band (IS 304). Thus, a shape profile 206 may be used to produce flatter pass-bands.

Figure 4A:
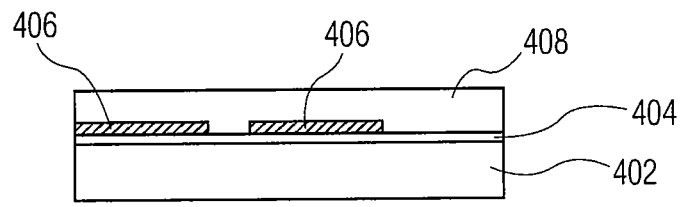
FIGS. 4A, 4B, 4C and 4D are cross-section diagrams illustrating a method for forming an exemplary piezoelectric device, according to an embodiment of the present invention.

Referring to FIGS. 4A-4D, a fabrication process for fabricating an exemplary contour mode piezoelectric device 412 is shown. In FIG. 4A, low-stress nitride (LSN) 404 may be deposited on silicon substrate 402 to provide electrical isolation. Bottom metal electrodes 406 are sputter-deposited in a suitable pattern by lift-off. For example, bottom metal electrodes 406 may be formed to have a variable width and a suitable shape profile. Piezoelectric layer 408 is sputter-deposited on LSN layer 404.

Figure 4B:
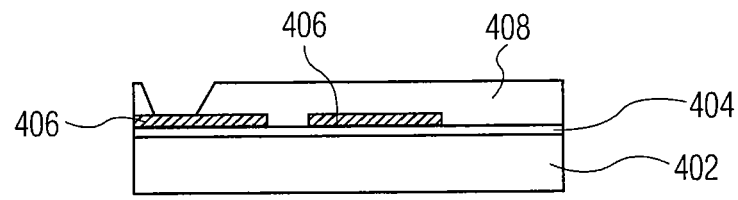
Figure 4C:
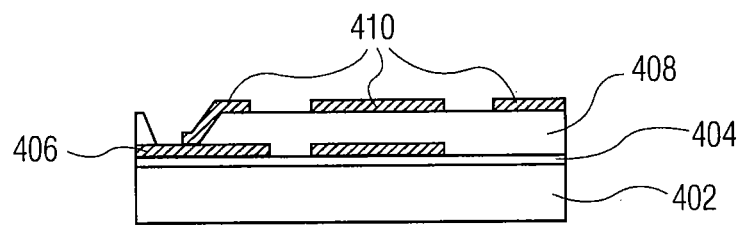

In FIG. 4B, contacts are opened through piezoelectric layer 408 to bottom metal electrodes 406, by a wet etching in a hot (e.g., 160° C.) phosphoric bath. In FIG. 4C, top metal electrodes 410 are sputter-deposited and patterned by a chlorine-based dry etching process. For example, top metal electrodes 410 may be patterned to have a variable width and any suitable shape profile.

Figure 4D:
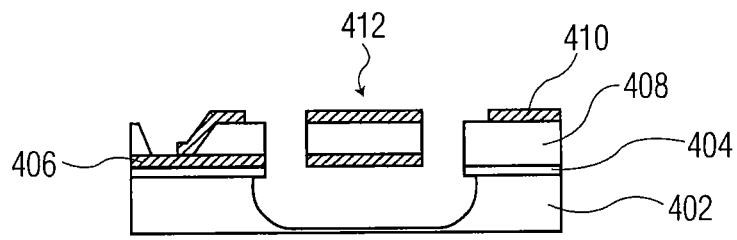

In FIG. 4D, piezoelectric film 408 is masked by a low-temperature oxide (LTO) and etched by a chlorine-based dry etching. The LTO and LSN 404 are etched and removed by a dry etching process. Device 412 is then released by dry etching from substrate 402 in xenon difluoride ($XeF_2$). Alternatively, the structures can be released by a wet etching process.

Insulating layer 404 may be formed from a material including silicon nitride, silicon dioxide, aluminum nitride, silicon carbide, titanium dioxide, polyimide dielectrics, hafnium dioxide, SU-8 photo resist polymer dielectrics, and combinations thereof.

For the fabrication of device 412, either bottom electrode 406, piezoelectric layer 408, and top electrode 410 can be formed using an evaporation-based process, a sol-gel process, a chemical vapor deposition process, a metallo organic chemical vapor deposition process, a metallo oxide chemical vapor deposition process, an epitaxial process, an etching from bulk process, or any combination thereof. Although bottom electrode 406 and top electrode 410 are each illustrated as being a continuous metal layer, it is contemplated that either bottom electrode 406, top electrode 410 or the combination thereof may be formed from multiple physically separated electrode segments with respectively different widths.

The fabrication process shown in FIGS. 4A-4D is post-CMOS compatible, enabling complete integration of passive micro-electromechanical systems (MEMS) and active CMOS components of a radio frequency (RF) system or any other high frequency circuitry.

Figure 5A:
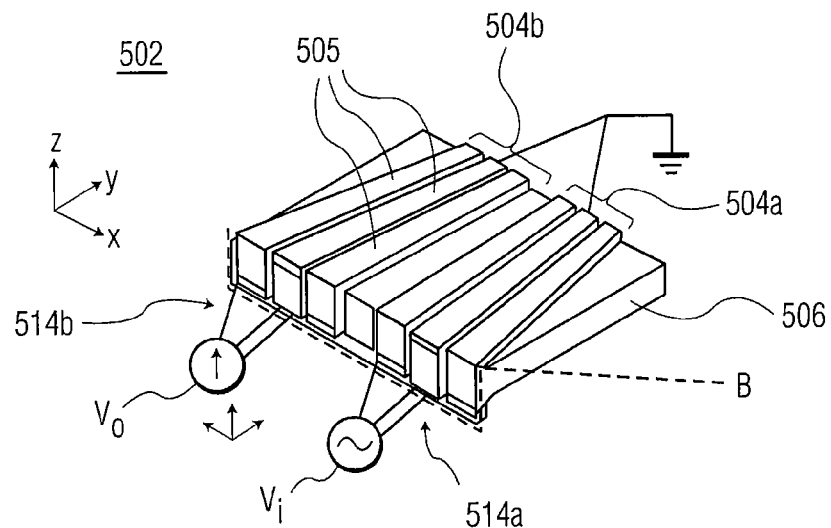
FIG. 5A is a perspective diagram of an exemplary two-port piezoelectric device, according to an embodiment of the present invention.
Figure 5B:
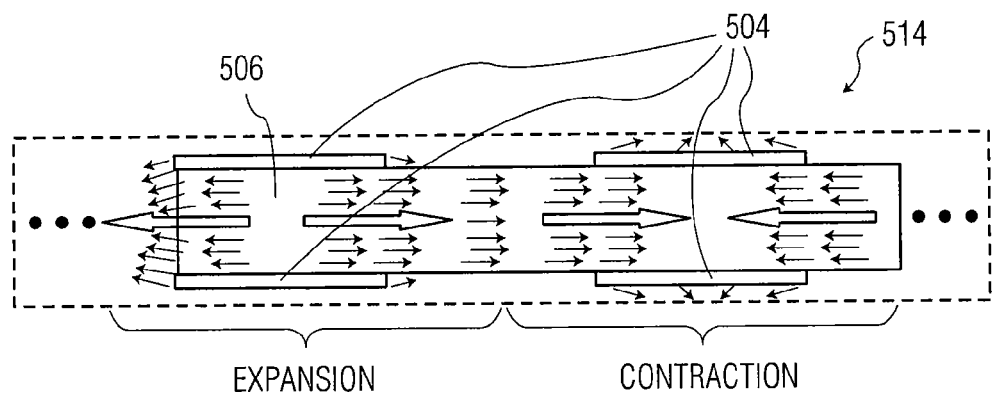
FIG. 5B is a cross-section diagram of a portion of the piezoelectric device shown in FIG. 5A along plane B, illustrating expansion and contraction of the piezoelectric film due to a bulk acoustic wave.
Figure 6A:
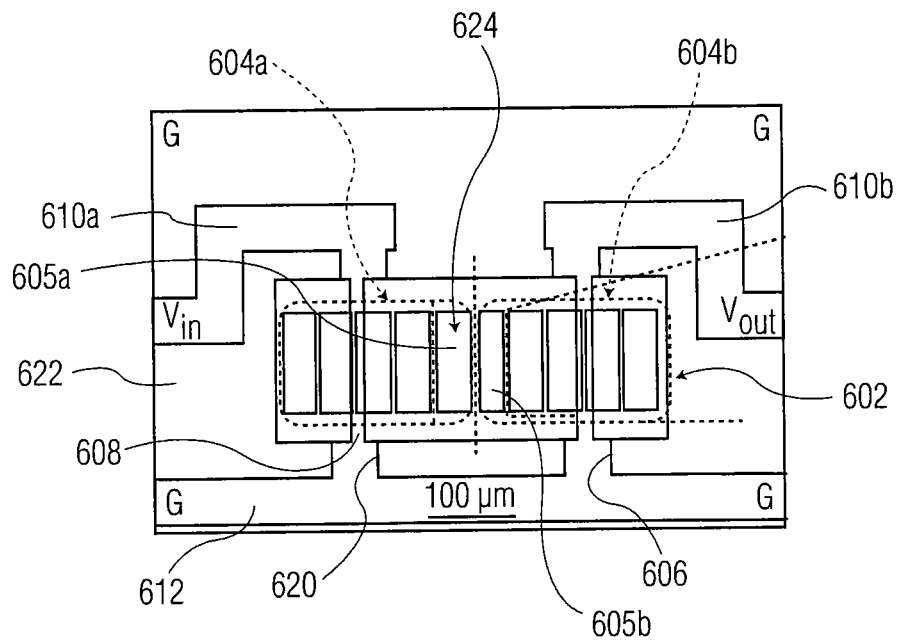
FIG. 6A is a micrograph of an exemplary multi-finger two-port piezoelectric device, according to another embodiment of the present invention.
Figure 6B:
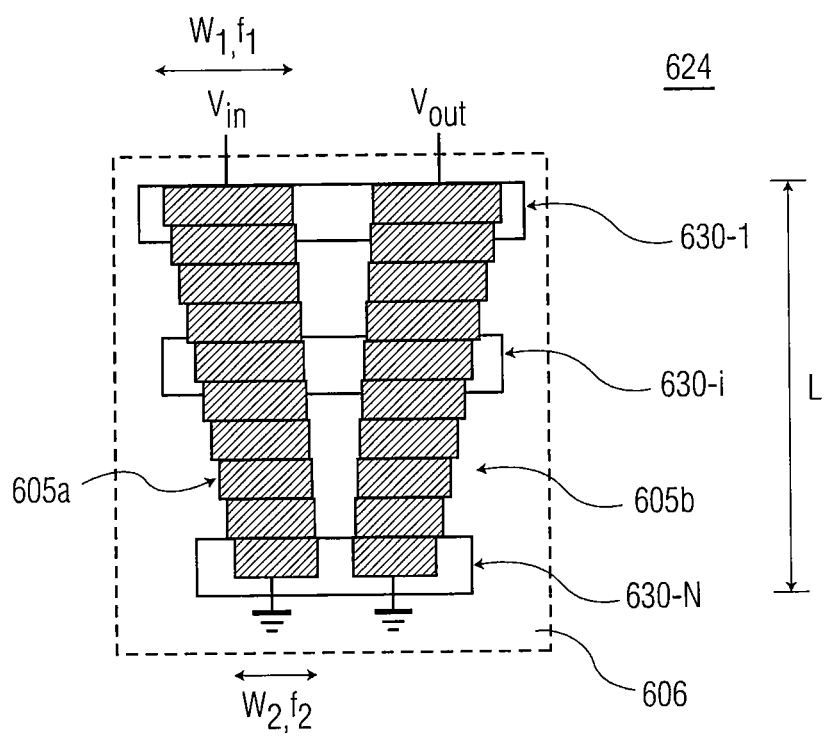
FIG. 6B is an overhead diagram of a portion of the piezoelectric device shown in FIG. 6A, illustrating a relationship between a plurality of sub-transducers and a center frequency of the piezoelectric device.
Figure 7:
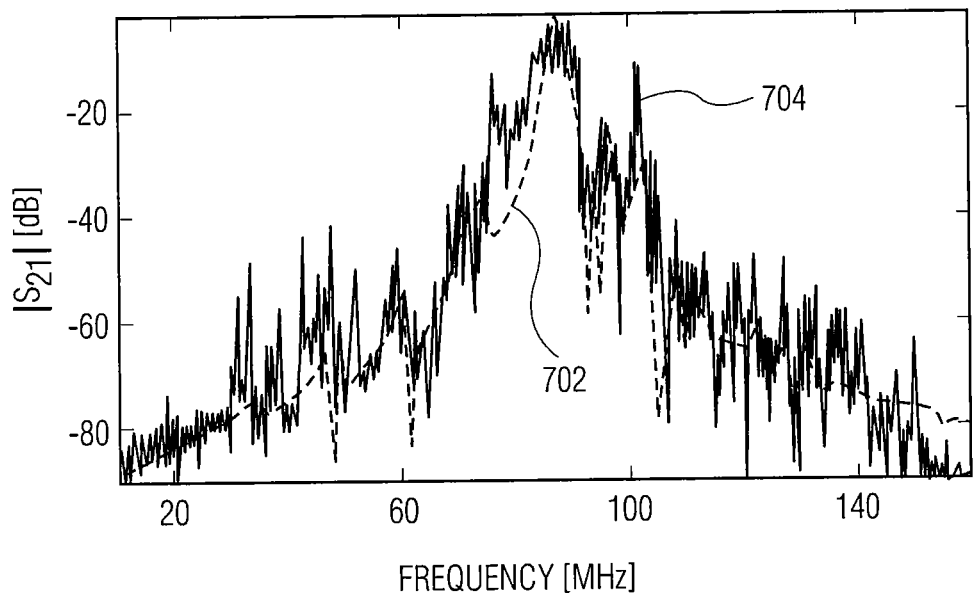
FIG. 7 is a graph of simulated and measured insertion loss as a function of frequency for the multi-finger piezoelectric device shown in FIG. 6A.

Referring next to FIGS. 5-7, two-port piezoelectric devices 502, 602 are described. In particular, FIG. 5A is a perspective diagram of multi-finger piezoelectric device 502; FIG. 5B is a cross-section diagram of a portion of piezoelectric device 502 along plane B, illustrating expansion and contraction of piezoelectric film 506; FIG. 6A is a micrograph of multi-finger piezoelectric device 602; FIG. 6B is an overhead diagram of a portion of piezoelectric device 602, illustrating a relationship between sub-transducers 630 and the center frequency of piezoelectric device 602; and FIG. 7 is a graph of simulated and measured insertion loss as a function of frequency for piezoelectric device 602.

In FIGS. 5A and 5B, piezoelectric device 502 includes top and bottom input electrodes 504a, 514a and top and bottom output electrodes 504b, 514b, respectively. Each electrode 504, 514 includes multiple fingers 505 that are respectively connected to input voltage $V_i$, output voltage $V_o$ and ground. Fingers 505 are connected electrically in parallel and mechanically in series.

Electrodes 504a, 514a are driven with opposite polarity relative to electrodes 504b, 514b. Because piezoelectric device 502 operates in a contour-mode (and because electrodes 504a, 504b have variable widths), a bulk acoustic wave within (i.e., throughout) piezoelectric film 506 is used to actuate/sense frequencies within a bandwidth. In contrast, a SAW device uses a surface acoustic wave that propagates along the surface of a piezoelectric film. Accordingly, contour mode piezoelectric device 502 includes interactions between two-dimensional and three-dimensional acoustics waves, with acoustic wave interaction within piezoelectric film 506.

As shown in FIG. 5B, piezoelectric device 502 includes expansion and contraction throughout piezoelectric film 506 based on the opposite polarities of which electrodes 504a, 504b, 514a, 514b are driven. Because electrodes 504, 514 are driven with opposite polarities, a higher order mode may be excited.

FIG. 6A is a photomicrograph of piezoelectric device 602 tethered to substrate 622. Input, output and ground electrical contacts 610a, 610a and 612 are shown, respectively coupled to corresponding input electrode 604a and output electrode 604b. FIG. 6A also illustrates device 602 spaced apart from substrate 622 via etched portion 620. In FIG. 6A, the multiple fingers 605a of input electrode 604a is separated from the multiple fingers 605b of output electrode 604B. Although not shown in FIG. 6A, piezoelectric device 602 includes bottom electrodes below piezoelectric film 606.

A portion 624 of piezoelectric device 602 that includes finger 605a of electrode 604a, finger 605b of electrode 604b, piezoelectric film 606 and corresponding bottom electrode fingers is shown in further detail in FIG. 6B. Portion 624 can be described as including a plurality of sub-transducers 630-1, 630-i, . . . , 630-N relative to length L of electrode fingers 605a, 605b. Electrode finger 605a is connected between input voltage $V_{in}$ and ground (G), and output electrode finger 605b is connected between output voltage $V_{out}$ and ground (G).

Each sub-transducer 630 include a segment of input and output electrode finger 605a, 605b, piezoelectric film 606 and corresponding bottom electrode finger segments (not shown). Each sub-transducer 630 corresponds to a different center frequency $f_c$. For example, sub-transducer 630-1 includes segments of electrode finger 605a, 605b having width $W_1$ and center frequency $f_1$. Sub-transducer 630-N, includes segments of electrode fingers 605a, 605b having width $W_2$ and center frequency $f_2$. The bandwidth (BW) of piezoelectric device 602 can be represented by equation 1 as:

$$BW \propto (f_2 - f_1) \propto (1/W_2 - 1/W_1) \qquad \text{eq. (1)}$$

Piezoelectric device 606 may be considered to be formed from a series of longitudinally coupled width-extensional mode sub-transducers 630, each having a progressively scaled center frequency $f_c$ defined by patterning at least one of the top electrodes 604 (or bottom electrodes). The individual sub-transducers 630 may be considered to be connected electrically in parallel. As predicted by a composite one-dimensional Mason model, a combination of resonant frequencies of each sub-transducer 630 results in broadening of the passband beyond a fundamental $k_t^2$ limit for electrically coupled filters (this limit is approximately 2.5% for aluminum nitride (AlN) resonators excited in contour-mode vibration).

Referring to FIG. 7, simulated insertion loss IS 702 and experimental insertion loss IS 704 are shown as a function of frequency for piezoelectric device 602. In addition, experimental results corresponding to center frequency $f_c$, insertion loss (IL), bandwidth (BW) and area are shown in Table 1 below. As shown in FIG. 7, experimental IS 704 corresponds with simulated IS 702. Experimental IS 704 illustrates bandwidths above 5% and an insertion loss ranging between 3.7 and 10 dB. Exemplary piezoelectric device 602 includes a ripple (of about 3-5 dB) in the pass-band.

TABLE 1

Experimental results for piezoelectric device 602

| $f_c$ (MHz) | IL (dB) | BW (%) | Area (mm$^2$) |
|---|---|---|---|
| 105.1 | 10.2 | 4.8 | 0.05 |
| 87.7 | 4.0 | 5.8 | 0.10 |
| 89.0 | 3.7 | 2.6 | 0.08 |

Figure 8A:
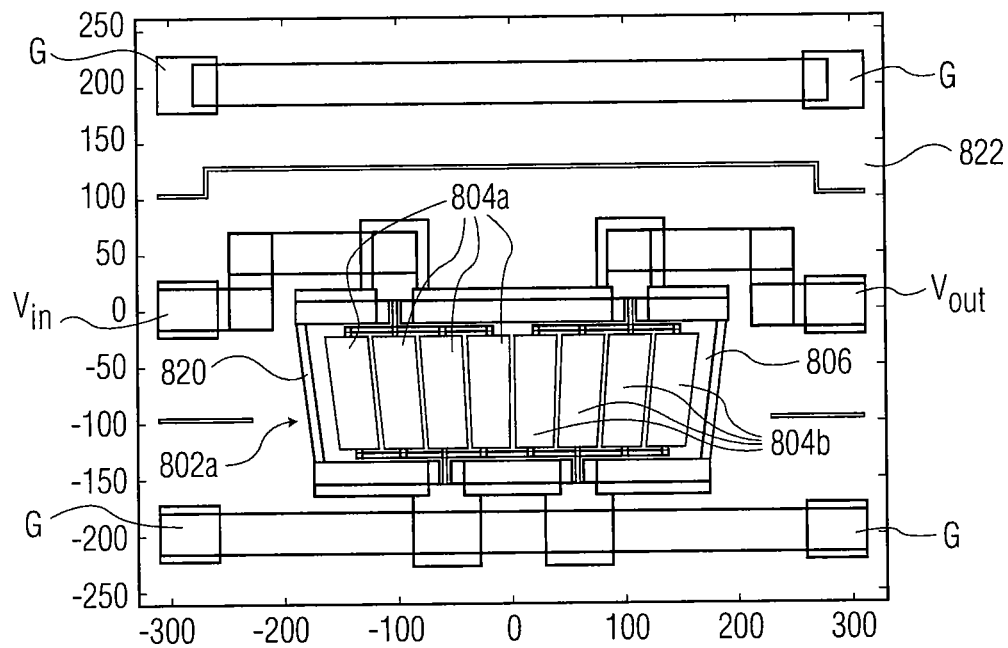
FIGS. 8A, 8B and 8C are overhead views of exemplary separate input/output (I/O) multi-finger piezoelectric devices, according to embodiments of the present invention.
Figure 8B:
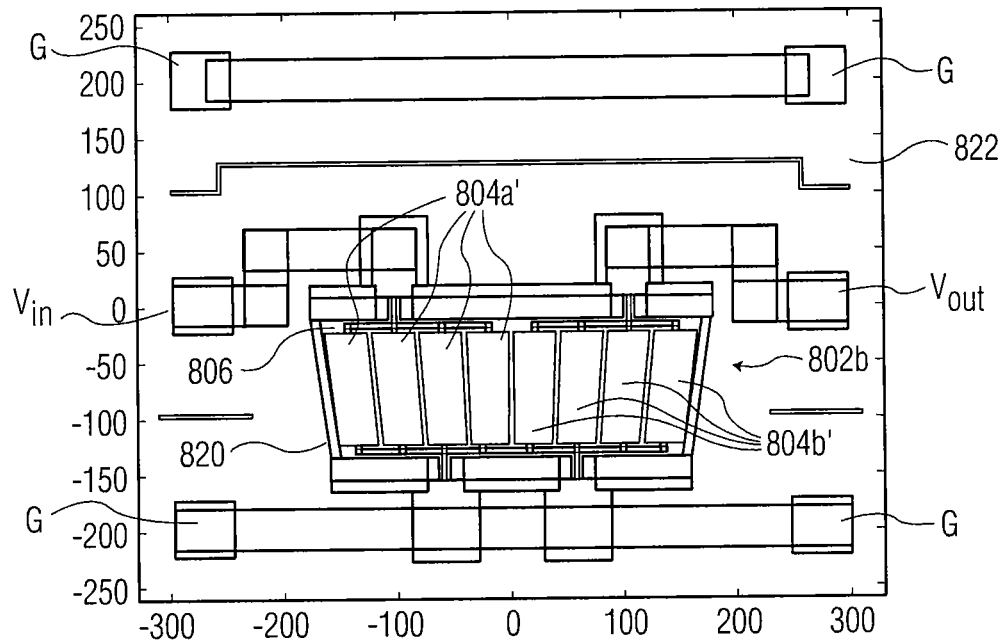
Figure 8C:
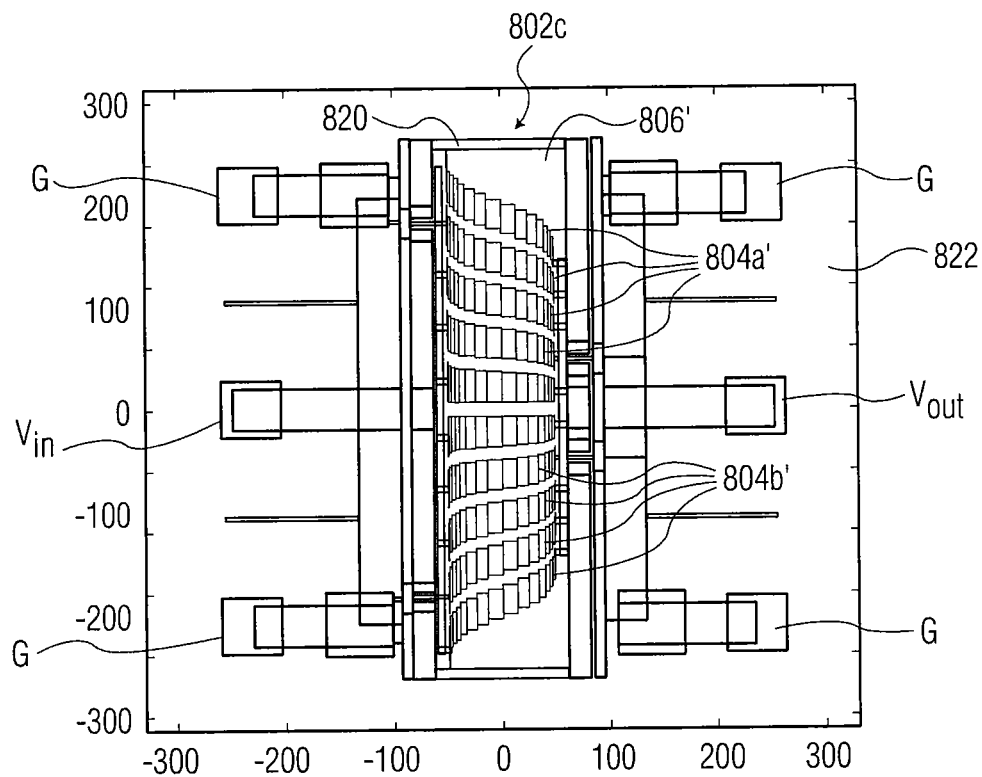
Figure 9A:
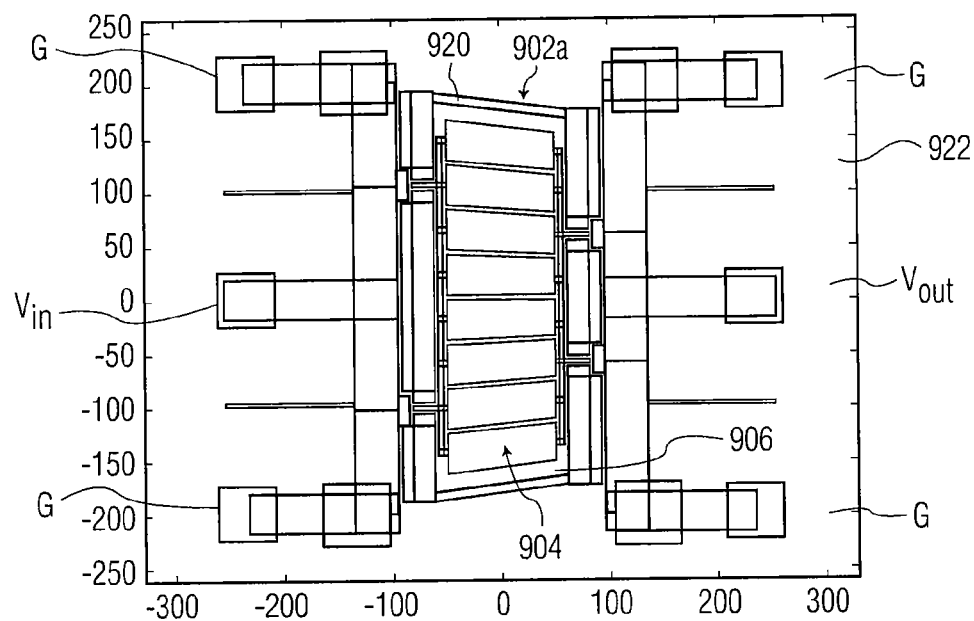
FIGS. 9A and 9B are overhead views of alternating I/O multi-finger piezoelectric devices, according to embodiments of the present invention.
Figure 9B:
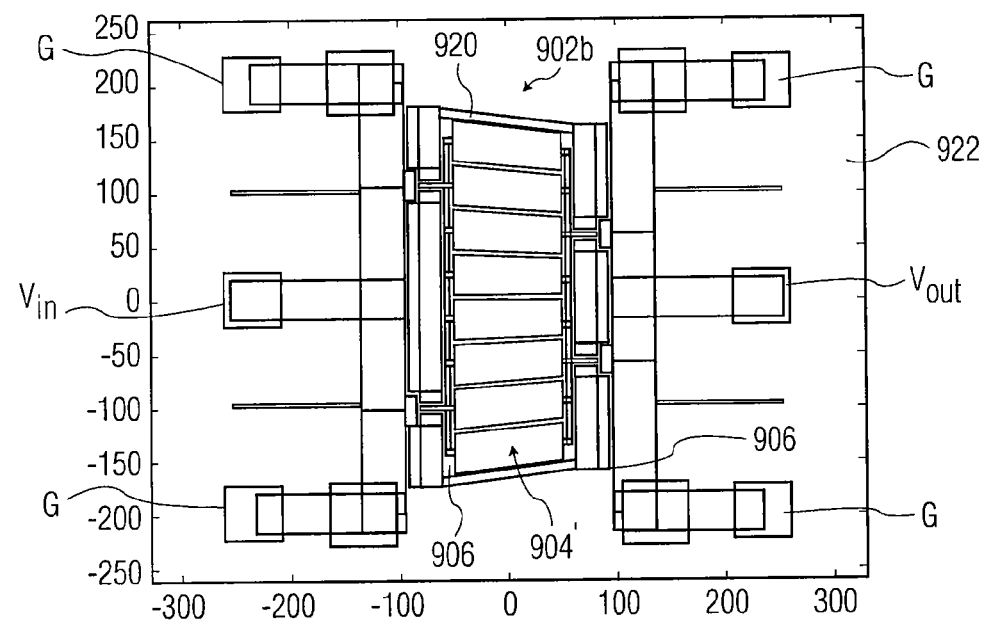
Figure 10A:
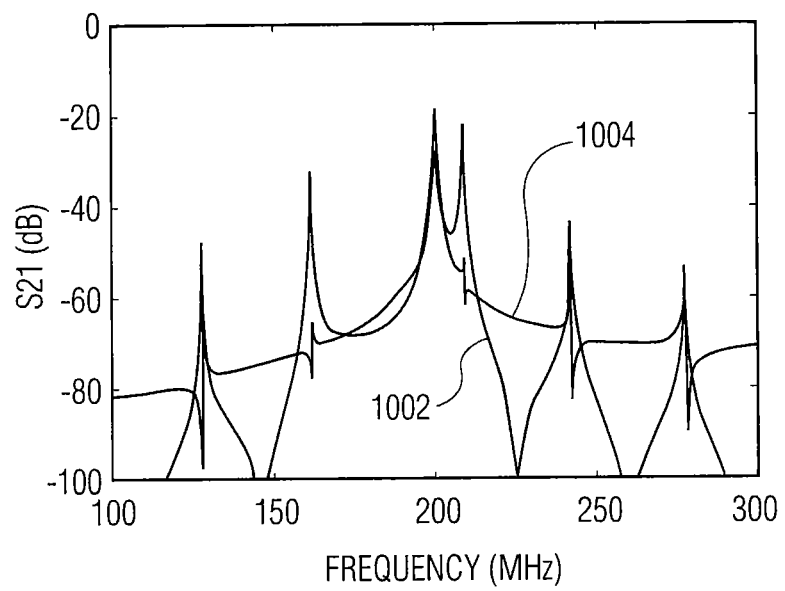
FIG. 10A is a graph of spurious modes as a function of frequency for piezoelectric devices having separate I/O and alternating I/O fingers, with rectangular electrodes.
Figure 10B:
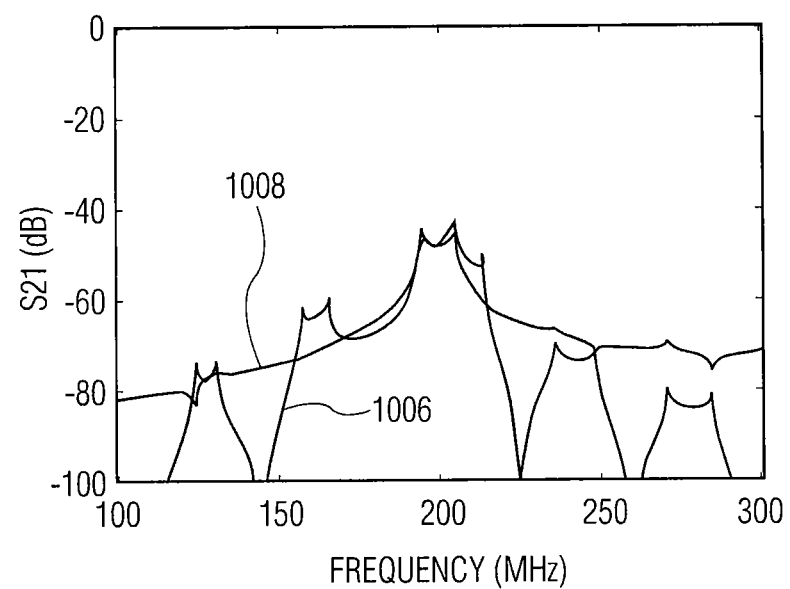
FIG. 10B is a graph of spurious modes as a function of frequency for piezoelectric devices having separate I/O and alternating I/O fingers, where the electrodes have a variable width.

Referring to FIGS. 8-10, different embodiments of piezoelectric devices having separate I/O multi-finger electrodes and alternating I/O multi-finger electrodes are shown. FIGS. 8A, 8B and 8C are overhead views of separate I/O multi-finger piezoelectric devices 802a, 802b, 802c; FIGS. 9A and 9B are overhead views of different alternating I/O multi-finger electrode piezoelectric devices 902a, 902b; FIG. 10A is a graph of spurious modes as a function of frequency for piezoelectric devices having separate I/O and alternating I/O multi-finger electrodes, with rectangular electrodes; and FIG. 10B is a graph of spurious modes as a function of frequency for piezoelectric devices having separate I/O and alternating I/O multi-finger electrodes, where the electrodes have a variable width.

Typically, mechanically coupled filters have separate excitation/sensing sections. For example, FIGS. 8A-8C, piezoelectric devices 802a, 802b and 802c have input electrode fingers 804a, 804a' separated from output electrode fingers 804b, 804b'. In FIG. 8A, electrode fingers 804a, 804b have a linear shape profile (i.e., no frequency weighting). In contrast, in FIGS. 8B and 8C, electrode fingers 804a' and 804b' have a non-linear shape profile. In FIG. 8C, the shape profile in piezoelectric device 802c is exaggerated to emphasize the non-linear electrode shaping.

In another embodiment, the input and output electrode fingers may be arranged in an alternating I/O configuration. For example, as shown in FIGS. 9A and 9B, piezoelectric devices 902a, 902b include an alternating I/O electrode fingers 904, 904'. Alternating electrode fingers 904' in FIG. 9B are the same as alternating electrode fingers 904 in FIG. 9A, except that alternating electrode fingers 904' have a non-linear shape profile.

The inventors have determined that separating the input/output electrodes fingers may introduce additional spurious responses, resulting from coupling among individual electrodes (i.e., fingers) in the input and output sections. By forming a piezoelectric device with an alternating input/output configuration, spurious (i.e., out of band) responses may be substantially reduced, thus, improving a rejection by the transducer. For example, referring to FIG. 10A, a multi-finger contour-mode piezoelectric device, having uniform width (i.e. rectangular) electrodes is described. In FIG. 10A, spurious mode response 1002 represents a piezoelectric device having separate input/output electrode sections. Spurious mode response 1004 represents a piezoelectric device having alternating input/output electrodes with uniform electrodes.

Referring to FIG. 10B, spurious mode responses for piezoelectric devices (with variable width electrodes) having separate input/output electrode sections (for example, piezoelectric device 802a (FIG. 8A)) and a piezoelectric device having alternating input/output electrodes (for example, piezoelectric device 902b (FIG. 9A)) are shown. Spurious mode response 1006 corresponds to an exemplary piezoelectric device having separate input/output electrodes. Spurious mode response 1008 corresponds to an exemplary piezoelectric device having alternating input/output electrodes.

It is understood that different electrode arrangements may be used in conjunction with alternating the electrodes, in order to emphasize different modes of vibration as compared with other modes of vibration. For example, input and output electrodes may be collected in pairs or as a threesome and alternated across the mechanical structure.

Figure 11A:
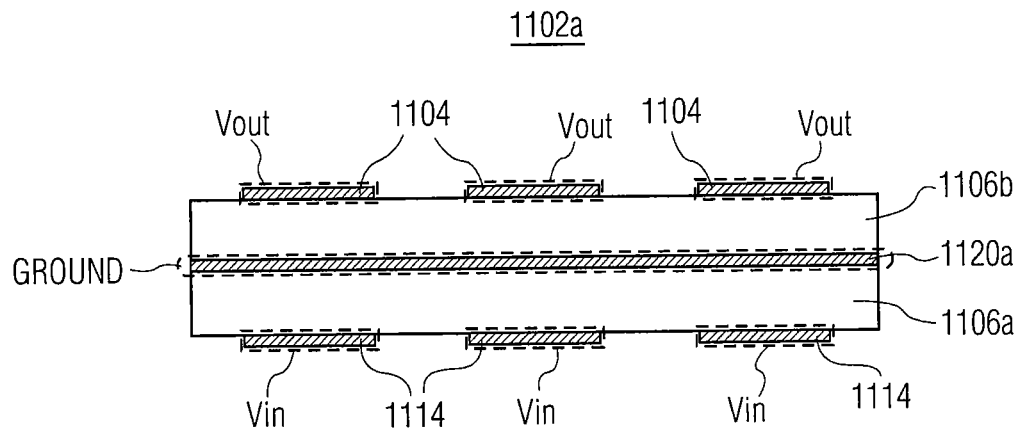
FIGS. 11A and 11B are cross-section diagrams of exemplary multi-layer piezoelectric devices, according to another embodiment of the present invention.
Figure 11B:
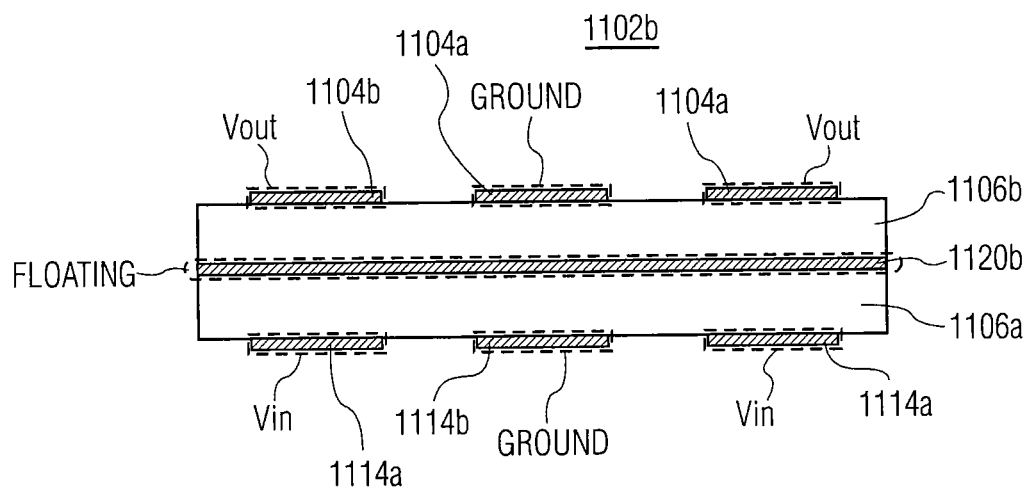

Referring next to FIGS. 11A and 11B, exemplary multi-layer piezoelectric device 1102a, 1102b are shown, respectively. In FIG. 11A piezoelectric layer 1106a is separated from piezoelectric layer 1106b by ground layer 1120a. Input electrodes 1114 are provided on one surface of piezoelectric layer 1106a. Output electrodes 1104 are provided on one surface of piezoelectric layer 1106b. Either input electrodes 1114, output electrodes 1104, or any combination thereof may be patterned to have a variable width and may further be patterned according to a shape profile.

In FIG. 11B, piezoelectric device 1102 includes piezoelectric layer 1106a separated from piezoelectric layer 1106B by floating layer 1120b. Input electrodes 1114a and ground electrodes 1114b are provided on one surface of piezoelectric layer 1106a. Output electrodes 1104a and ground electrodes 1104b are provided on a surface of piezoelectric layer 1106b. Floating layer 1120b is a metal material that is not electrically connected (i.e. is electrically isolated).

A similar fabrication process may be used, as described above, to form multi-layer piezoelectric devices 1102a, 1102b. For example, a second piezoelectric layer 1106b may be deposited after patterning layer 1120a (1120b). Further electrodes 1104 (1104a, 1104b) may then be deposited and patterned, as described above.

Multi-layer piezoelectric devices 1102a, 1102b may enable different electric field geometry to used, and therefore, different actuations schemes. Piezoelectric devices 1102a, 1102b may also potentially reduce electrical input/output feed-through, by separating the electrodes with a metal layer 1120a, 1120b.

Piezoelectric devices according to the present invention provide broader bandwidths than conventional piezoelectric devices, while retaining a lithographic-level control over the center frequency. In addition, embodiments of the present invention allow independent control over the shape of the pass-band response, thus allowing a reduction of the ripple of the device. Finally, by changing the arrangement of input and output electrodes, the spurious mode responses may be reduced, thus improving an off-band rejection. Both the center frequencies and bandwidths of exemplary piezoelectric devices are shown to be lithographically controllable, allowing for multiple devices operating on different bands to be fabricated side-by-side.

The wider bandwidth and multiple bands provided by the exemplary piezoelectric devices described herein responds to the growing need of the wireless industry to increase an amount of data transfer in a given spectrum, and to customer pressure to increase functionality in existing devices. Furthermore, the wider bandwidth and multiple bands may translate into a higher dynamic range and a possible reduction in false alarm rates, if the exemplary piezoelectric transducer is used for resident sensing applications.

The exemplary piezoelectric devices are capable of defining bandwidths beyond the intrinsic electromechanical limits ($k_t^2$), by using arrays of mechanically coupled sub-transducers of different frequencies. The individual sub-transducers are closely packed and introduce a variable width in the electrodes used for exciting vibrations in the micromechanical structure. Each sub-transducer may be considered to be an infinitesimal section of the device. The exemplary piezoelectric devices of the present invention provides a piezoelectric transducer that combines the responses of a plurality of individual sub-transducers and that is extremely compact and smaller than other conventional piezoelectric transducers.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A contour mode piezoelectric device comprising: a piezoelectric film having first and second surfaces and suspended so that it is spaced away from a substrate; and first and second patterned electrodes respectively disposed on said first and second surfaces of the piezoelectric film, at least one of the first and second patterned electrodes having a) unequal width at multiple locations simultaneously along a length thereof and b) being without any openings along said width.

2. The contour mode piezoelectric device according to claim 1, wherein a combination of a center frequency and a bandwidth of the piezoelectric device is selected based on at least one of the variable width of said patterned electrode and a shape of said piezoelectric film.

3. The contour mode piezoelectric device according to claim 2, wherein the shape of piezoelectric film includes at least one of a rectangle, a circle, a ring or a polygon.

4. The contour mode piezoelectric device according to claim 2, wherein the piezoelectric device includes a plurality of sub-transducers positioned along a length thereof, the plurality of sub-transducers associated with a respective plurality of different center frequencies, and each sub-transducer includes a respective portion of the first and second patterned electrodes and a corresponding portion of the piezoelectric film.

5. The contour mode piezoelectric device according to claim 4, wherein the center frequency and the bandwidth of the piezoelectric device is based on the combination of the plurality of different center frequencies of the sub-transducers.

6. The contour mode piezoelectric device according to claim 4, wherein the plurality of sub-transducers are mechanically coupled to each other and electrically coupled to each other in parallel.

7. The contour mode piezoelectric device according to claim 1, wherein at least one of the first and second patterned electrodes is patterned with a shape profile relative to the respective length.

8. The contour mode piezoelectric device according to claim 7, wherein the shape profile includes at least one of a linear profile, a nonlinear profile, a quadratic profile, an exponential profile or a logarithmic profile.

9. The contour mode piezoelectric device according to claim 1, wherein the piezoelectric film is formed from a material including aluminum nitride, zinc oxide, lead zirconate titanate, gallium arsenide, aluminum gallium arsenide or any combination thereof.

10. The contour mode piezoelectric device according to claim 1, wherein the first and second patterned electrodes are formed from a material including aluminum, platinum, iridium, ruthenium, molybdenum, titanium or copper.

11. The contour mode piezoelectric device according to claim 1, wherein the first and second patterned electrodes form a pair of electrodes and the pair of electrodes includes at least one pair of input electrodes and at least one pair of output electrodes.

12. The contour mode piezoelectric device according to claim 11, wherein each pair of input and output electrodes includes multiple fingers.

13. The contour mode piezoelectric device according to claim 12, wherein the multiple fingers of the input electrodes are separated from the multiple fingers of the output electrodes.

14. The contour mode piezoelectric device according to claim 12, wherein the multiple fingers of the input electrodes are alternated with the multiple fingers of the output electrodes.

15. The contour mode piezoelectric device according to claim 1, wherein the piezoelectric film includes first and second piezoelectric films separated from each other by a metallic layer and the first and second patterned electrodes are respectively disposed on the first and second piezoelectric films.

16. The contour mode piezoelectric device according to claim 15, wherein the metallic layer includes a floating layer.

17. The contour mode piezoelectric device according to claim 15, wherein the metallic layer includes a ground layer.

18. A method of forming a contour mode piezoelectric device, the method comprising: forming a piezoelectric film having first and second surfaces and suspended so that it is spaced away from a substrate; and forming first and second patterned electrodes respectively disposed on said first and second surfaces of the piezoelectric film, including forming at least one of the first and second patterned electrodes to have a) unequal width at multiple locations simultaneously along a length thereof and b) being without any openings along said width.

19. The method according to claim 18, the method including selecting a combination of a center frequency and a bandwidth of the piezoelectric device based on at least one of the variable width of said patterned electrode and a shape of said piezoelectric film.

20. The method according to claim 19, wherein forming the at least one of the first and second patterned electrodes to have the variable width includes selecting multiple frequencies to be excited by the piezoelectric device, the multiple frequencies contributing to the center frequency and the bandwidth of the piezoelectric device.

21. The method according to claim 20, the method including adjusting a weighting of the multiple frequencies that are excited by applying a shape profile to the patterned electrode having the variable width along the length thereto, wherein the weighting is adjusted to control a ripple content in a pass-band of the contour mode piezoelectric device.

22. The method according to claim 18, forming the first and second patterned electrodes corresponding to a forming a pair of electrodes, forming the pair of electrodes including forming at least one pair of input electrodes and at least one pair of output electrodes.

23. The method according to claim 22, wherein the input and output electrodes are arranged to reduce a spurious mode of the piezoelectric device.

24. The method according to claim 18, forming the piezoelectric film including: forming first and second piezoelectric films; and disposing a metallic layer between the first and second piezoelectric films, wherein the first and second patterned electrodes are formed on the respective first and second piezoelectric films.

* * * * *